(12) United States Patent
Yamada et al.

(10) Patent No.: US 8,294,272 B2
(45) Date of Patent: Oct. 23, 2012

(54) POWER MODULE

(75) Inventors: Yasushi Yamada, Miyoshi (JP); Hiroshi Osada, Komaki (JP); Gentaro Yamanaka, Nagoya (JP); Norifumi Furuta, Toyota (JP); Akio Kitami, Toyota (JP); Tadafumi Yoshida, Kasugai (JP); Hiromichi Kuno, Aichi-ken (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 266 days.

(21) Appl. No.: 12/728,442

(22) Filed: Mar. 22, 2010

(65) Prior Publication Data

US 2010/0237507 A1    Sep. 23, 2010

(30) Foreign Application Priority Data

Mar. 23, 2009  (JP) ................... 2009-070656
Feb. 10, 2010  (JP) ................... 2010-027509

(51) Int. Cl.

| H01L 23/36 | (2006.01) |
| H01L 23/38 | (2006.01) |
| H01L 23/34 | (2006.01) |
| H01L 25/07 | (2006.01) |
| H01L 23/48 | (2006.01) |
| H01L 25/16 | (2006.01) |
| H01L 35/28 | (2006.01) |

(52) U.S. Cl. ........... 257/773; 257/E23.08; 257/E21.509; 257/E29.068; 257/E23.103; 257/E23.023; 257/E21.502; 257/77; 257/76; 257/750; 257/779; 257/686; 257/723; 257/777; 257/772; 257/706; 257/690

(58) Field of Classification Search ........... 257/E21.509, 257/772, E29.068, 779, 77, 750, 76, E23.103, 257/E23.023, E21.502, 706, 690, E23.08, 257/773, 686, 723, 777; 438/119, 122; 427/295; 428/576; 228/252; 174/126.1

See application file for complete search history.

(56) References Cited

U.S. PATENT DOCUMENTS

| 5,207,674 A * | 5/1993 | Hamilton ................... 606/20 |
| 6,023,403 A * | 2/2000 | McGuire et al. ............ 361/106 |
| 6,407,508 B1 * | 6/2002 | Kawada et al. ............. 315/169.3 |
| 2009/0194862 A1 * | 8/2009 | Kitami .......................... 257/690 |
| 2010/0109016 A1 * | 5/2010 | Yagi et al. ..................... 257/76 |

FOREIGN PATENT DOCUMENTS

| CN | 1333566 A | 1/2002 |
| JP | A-2002-26251 | 1/2002 |
| JP | A-2007-19130 | 1/2007 |
| JP | 2010-251711 | * 11/2010 |

OTHER PUBLICATIONS

Oct. 26, 2011 Office Action issued in Chinese Patent Application No. 201010145620.6 (with translation).

* cited by examiner

*Primary Examiner* — A O Williams

(74) *Attorney, Agent, or Firm* — Oliff & Berridge, PLC

(57) ABSTRACT

A power module includes a pair of power devices that are stacked with a plate-shaped output electrode arranged therebetween, and an N-electrode and a P-electrode that are stacked with the pair of power devices arranged therebetween. The output electrode is anisotropic such that the thermal conductivity in a direction orthogonal to the stacking direction is greater than the thermal conductivity in the stacking direction. Also, the output electrode extends in the orthogonal direction from a stacked area where the pair of power devices are stacked. The N-electrode and the P-electrode extend in the orthogonal direction while maintaining an opposing positional relationship.

7 Claims, 4 Drawing Sheets

POWER MODULE

INCORPORATION BY REFERENCE

The disclosures of Japanese Patent Applications No. 2009-070656 filed on Mar. 23, 2009 and No. 2010-027509 filed on Feb. 10, 2010 including the specifications, drawings and abstracts are incorporated herein by reference in its entirety.

BACKGROUND OF THE INVENTION

1. Field of the Invention

The invention relates to a power module.

2. Description of the Related Art

Japanese Patent Application Publication No. 2002-26251 (JP-A-2002-26251) describes one example of a related power module. The power module described in JP-A-2002-26251 has a pair of power devices that are stacked with a plate-shaped output electrode arranged therebetween, and an N-electrode and a P-electrode that are stacked with the pair of power devices therebetween. The power module described in JP-A-2002-26251 is advantageous in that the overall power module is able to be made small because the N-electrode, the first power device, the output electrode, the second power device, and the P-electrode are stacked vertically.

If the output electrode that is positioned between the pair of power devices has a portion that extends in the orthogonal direction (i.e., the direction orthogonal to the direction in which the pair of power devices are stacked) from the area where the pair of power devices are stacked (i.e., the stacked area), that is, if that output electrode has a portion that is exposed and not covered by the pair of power devices, then heat can be released from that exposed portion. With this related power module, the output electrode that is positioned between the pair of power devices is made of material such as copper or copper alloy. The thermal conductivity of these materials is isotropic. That is, the thermal conductivity in the stacking direction and the thermal conductivity in the orthogonal direction are the same.

Forming the output electrode of a material having high thermal conductivity is advantageous for increasing the amount of heat released from the exposed portion (i.e., for increasing the cooling amount by the exposed portion). However, ordinary material has isotropic thermal conductivity, so if the output electrode is formed of material having high thermal conductivity, a large amount of heat will also be transferred between the pair of power devices. As a result, thermal interference tends to occur between the pair of power devices, and the power devices tend to overheat.

On the other hand, forming the output electrode Of material having low thermal conductivity, is advantageous for preventing thermal interference between the pair of power devices. However, as described above, the output electrode has isotropic thermal conductivity, so the amount of heat released from the exposed portion of the output electrode ends up decreasing.

SUMMARY OP THE INVENTION

This invention both increases the amount of heat released at the exposed portion of the output electrode and prevents thermal interference from occurring between the pair of power devices, which is something that the related art is not able to do. That is, this invention provides technology capable of preventing thermal interference from occurring between the pair of power devices, while increasing the amount of heat released at the exposed portion of the output electrode.

A first aspect of the invention relates to a power module that includes a plate-shaped output electrode, a pair of power devices stacked with the output electrode arranged therebetween, and an N-electrode laminated to one of the power devices, and a P-electrode laminated to the other power device. In this power module, the output electrode is anisotropic such that the thermal conductivity in a direction orthogonal to the stacking direction in which the N-electrode and the P-electrode are stacked is greater than the thermal conductivity in the stacking direction. Also, the output electrode extends in the orthogonal direction from a stacked area where the pair of power devices are stacked, and the N-electrode and the P-electrode extend in the orthogonal direction while maintaining an opposing positional relationship.

With this power module, the thermal conductivity in the stacking direction of the output electrode that is arranged between the pair of power devices is low, which makes it easy to prevent thermal interference from occurring between the pair of power devices. On the other hand, the thermal conductivity in the orthogonal direction of the output electrode that is arranged between the pair of power devices is high, which enables the amount of heat released at the exposed portion of the output electrode to be increased. Together, these a power module in which the power devices will not easily overheat is able to be obtained.

In the power module of the invention, the output electrode may be laminated to the pair of power devices in part of the stacked area of the power devices. In this case, the N-electrode and the P-electrode may be laminated to the surfaces of the power devices that face one another, in a region of the stacked area where the output electrode is not laminated to the power devices.

In this power module, the N-electrode and the P-electrode are laminated to the surfaces of the power devices that face one another, i.e., the N-electrode is laminated to the surface of one of the power devices that is the side facing the other power device, and the P-electrode is laminated to the surface of the other power device that is on the side facing the power device with the N-electrode laminated to it such that the N-electrode and the P-electrode face each other. That is, in this power module, horizontal power devices in which the output electrode and the N-electrode (or the P-electrode) are laminated to the same surface of the power device are used. Because horizontal power devices are used in this power module, the N-electrode and the P-electrode that are laminated to opposing surfaces of the power devices are maintained in a close opposing positional relationship. Maximum mutual inductance that reduces parasitic inductance is generated by passing current in opposite directions through the closely opposing N-electrode and the P-electrode, i.e., in one direction through the N-electrode and in the opposite direction through the P-electrode, to produce reverse magnetic fields which then negate each other. As a result, parasitic inductance can be reduced. Furthermore, in this power module, the output electrode and the N-electrode (or the P-electrode) are laminated to the same surface of the power device, so the entire surface on the side where the output electrode or the like of the power device is not laminated can be used as the heat radiating surface. As a result, a power module in which the power devices are even less prone to overheating can be obtained.

Further, in the power module of the invention, at least one of the N-electrode or the P-electrode may be anisotropic such that the thermal conductivity in the orthogonal direction is greater than the thermal conductivity in the stacking direction.

In this power module, the thermal conductivity in the stacking direction of at least one of the N-electrode or the P-electrode that is arranged between the pair of power devices is low, which makes it even easier to prevent thermal interference from occurring between the pair of power devices. On the other hand, the thermal conductivity in the orthogonal direction of at least one of the N-electrode or the P-electrode that is arranged between the pair of power devices is high, which enables the amount of heat released at the exposed portion of at least one of the N-electrode or the P-electrode to be increased. Accordingly, a power module in which the power devices are even less prone to overheating is able to be obtained.

In the power module of the invention, the N-electrode and the P-electrode may be stacked with the pair of power devices arranged therebetween.

In this power module, the N-electrode and the P-electrode are stacked with the pair of power devices arranged therebetween. That is, in this power module, vertical power devices in which the output electrode and the N-electrode (or the P-electrode) are laminated to different surfaces of the power device are used. These vertical power devices are more easily able to handle high voltage and large current compared with the horizontal power devices described above. Therefore, the power module is able to better handle high voltage, and large current.

In the power module of the invention, a cooler may be mounted to the output electrode in a region where the output electrode extends in the orthogonal direction from the stacked area.

In this power module, a cooler is provided mounted to the output electrode in a region where the output electrode that extends in the orthogonal direction from the stacked area of the pair of power devices, thus enabling the exposed portion of the output electrode to, be cooled. Accordingly, the amount of heat released at the exposed portion of the output electrode can be increased even more. Because the output electrode can be cooled, the heat removing performance of the output electrode will not decrease even if the power module is used for an extended period of time. Therefore, a power module in which the power devices are even less prone to overheating can be obtained.

In the power module of the invention, a condenser may be connected between portions of the N-electrode and the P-electrode that extend in the orthogonal direction.

In this power module, a condenser is connected between the portions of the N-electrode and the P-electrode that extend in the orthogonal direction. Therefore, the surge voltage generated during switching operations of the power devices can be reduced.

In particular, with a power module having a structure in which the N-electrode and the P-electrode are stacked with the pair of power devices arranged therebetween, such as that described above, both the N-electrode and the P-electrode may have a portion that extends in the stacking direction from the portion where the N-electrode and the P-electrode are stacked with the pair of power devices arranged therebetween, and narrows the gap between the N-electrode and the P-electrode, and a portion that extends in the orthogonal direction while maintaining that narrow gap. Further, a condenser may be connected between the N-electrode and the P-electrode at the portions that extend in the orthogonal direction while maintaining the narrow gap.

In this case, both the N-electrode and the P-electrode have a portion that extends in the orthogonal direction while maintaining the narrow gap. Therefore, the mutual inductance described above is generated by passing current in opposite directions through the N-electrode and the P-electrode (i.e., in one direction through the N-electrode and in the opposite direction through the P-electrode). As a result, parasitic inductance can be reduced.

In the power module of the invention, a thermoelectric transducer may be incorporated on the opposite side of one of the power devices from the side with the surface to which the output electrode is laminated.

In this power module, a thermoelectric transducer is incorporated on the opposite side of one of the power devices from the side with the surface to which the output electrode is laminated. With this power module, passing current through the thermoelectric transducer causes the thermoelectric transducer to absorb heat from the surface that is on the power device side and release that heat from the other surface. This is known as the Peltier effect. The power devices are cooled by this Peltier effect. The power devices can also be cooled in advance by passing current through this thermoelectric transducer in advance. If the power devices are cooled in advance, the power devices will not overheat even if they momentarily generate a large amount of heat. Therefore, the cooling performance of the power devices can be improved, such that a power module in which the power devices are even less prone to overheating can be obtained.

The invention is thus able to provide an extremely durable power module in which the pair of power devices will not easily overheat.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

The technical characteristics of the example embodiments described below are summarized as follows.
(1) Vertical IGBTs or FETs are used for the power devices.
(2) A plate-shaped self-heat pipe or graphite material is used for the output electrode.
(3) The output electrode cooler is made of silicon.
(4) The N-electrode and the P-electrode are preferably arranged parallel to and facing each other to effectively generate mutual inductance that reduces parasitic inductance.
(5) Making the opposing portions of the N-electrode and the P-electrode as long as possible increases the portion where mutual inductance that reduces the parasitic inductance can be obtained, so both electrodes are preferably arranged opposing one another and so as to come as close together as possible from near the power devices.
(6) A thin flat condenser with $SrTiO_3$ as its main component is used as the condenser provided between the N-electrode and the P-electrode that are arranged close together facing one another.

(7) The thermoelectric transducer is surrounded by a thermal mass member, and a cooler is provided for that thermal mass member.

(8) Horizontal IGBTs or FETs may also be used for the power devices.

(9) A plate-shaped self-heat pipe or graphite material may also be used for the N-electrode and the P-electrode.

(10) The N-electrode and the P-electrode may also be stacked with an insulating layer arranger therebetween. Also, a condenser may be embedded in the insulating layer.

First Example Embodiment

A first example embodiment of the power module of the invention will now be described with reference to FIG. 1 which is a sectional view showing a frame format of the main portions of the power module according to this first example embodiment. The power module in this example embodiment is a power module that forms part of a three-phase inverter that is formed by three phases (i.e., U, W, and V).

Figure 1:
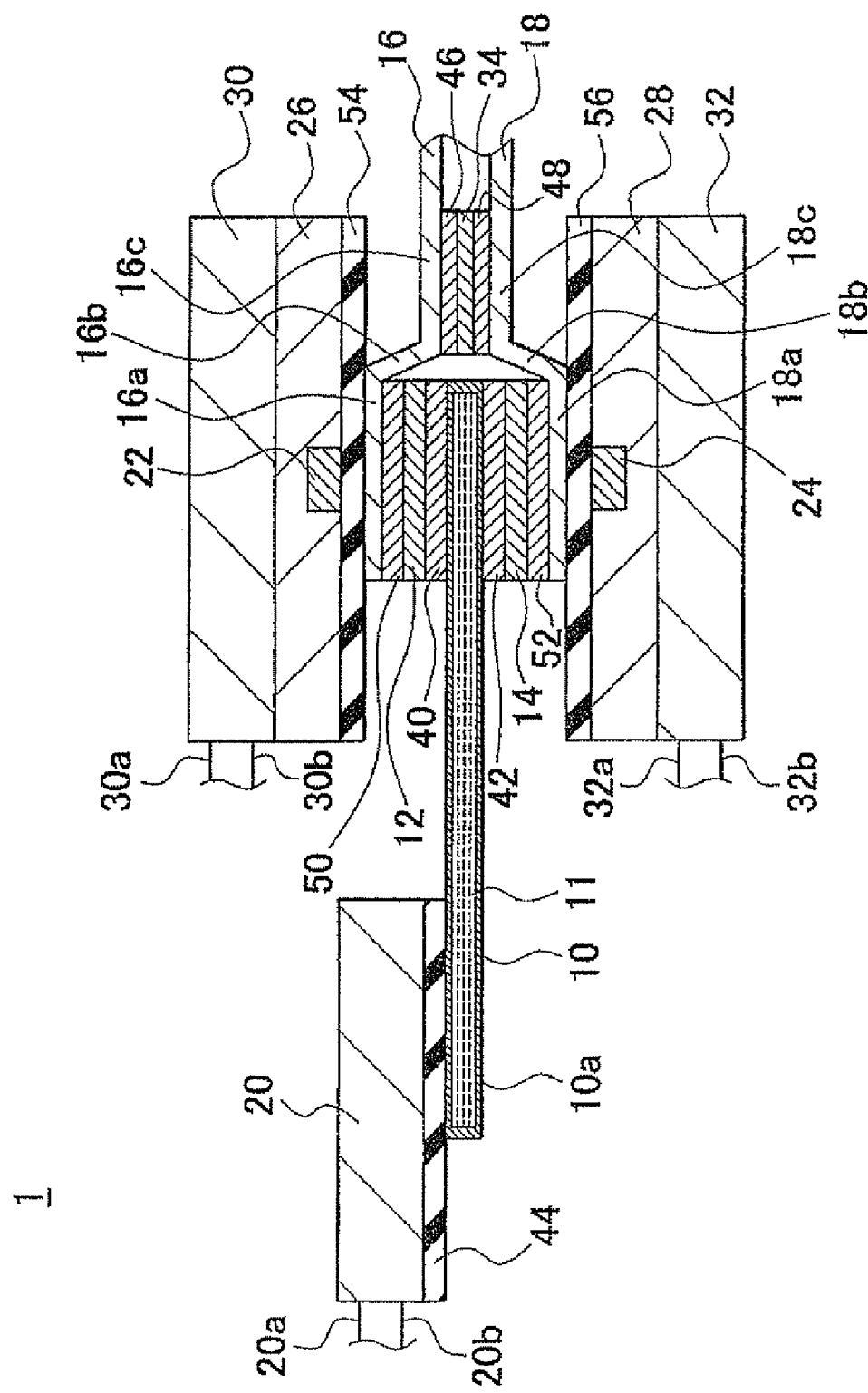
FIG. 1 is a sectional view showing a frame format of the main portions of a power module according to a first example embodiment of the invention.

As shown in FIG. 1, the power module 1 in this example embodiment has a pair of power devices 12 and 14 that are stacked with a plate-shaped output electrode 10 arranged between the pair of power devices 12 and 14, and an N-electrode 16 and a P-electrode 18 that are stacked with the pair of power devices 12 and 14 arranged between the N-electrode 16 and the P-electrode 18. The output electrode 10 extends from the area where the power devices 12 and 14 are stacked (hereinafter simply referred to as the stacked area), in a direction orthogonal to that stacking direction (i.e., orthogonal to the vertical direction in FIG. 1). That is, the output electrode 10 extends in the horizontal direction in FIG. 1, which will hereinafter be referred to as the orthogonal direction. An output electrode cooler 20 is mounted to an exposed portion 10a of the output electrode 10 that extends in the orthogonal direction from the stacked area.

Also, a thermoelectric transducer 22 is provided above a portion 16a of the N-electrode 16 that is laminated to the power device 12, and a thermoelectric transducer 24 is provided below a portion 18a of the P-electrode 18 that is laminated to the power device 14. Furthermore, the thermoelectric transducer 22 is surrounded by a thermal mass member 26, and the thermoelectric transducer 24 is surrounded by a thermal mass member 28. A cooler 30 is mounted above the thermal mass member 26, and a cooler 32 is provided below the thermal mass member 28.

As shown in FIG. 1, the N-electrode 16 and the P-electrode 18 have portions 16b and 18b (hereinafter referred to as "gap-changing portions"), respectively, that extend in the stacking direction from portions 16a and 18a that are stacked with the pair of power devices 12 and 14 arranged therebetween (hereinafter referred to as "stacked portions") and narrow the gap between the electrodes, and portions (hereinafter referred to as "close opposing portions") 16c and 18c that maintain the narrow gap and extend in the orthogonal direction. A condenser 34 is connected between the close opposing portions 16c and 18c of the N- and P-electrodes 16 and 18, respectively.

Incidentally, the overall thickness of the power module 1 in this example embodiment is approximately 20 millimeters.

In this example embodiment, IGBTs are used for the power devices 12 and 14. Semiconductor devices such as power MOSFETs or the like may also be used instead of IGBTs for the power devices 12 and 14. The thickness of these power devices 12 and 14 is approximately several tenths of a millimeter to 1 millimeter.

The output electrode 10 is formed by a plate-shaped self-heat pipe. This self-heat pipe is a tube-shaped member filled with fluid 11 for transferring heat. This self-heat pipe is anisotropic such that the thermal conductivity in the orthogonal direction (i.e.; the horizontal direction) is greater than thermal conductivity in the stacking direction (i.e., the vertical direction). More specifically, the self-heat pipe is formed such that the thermal conductivity in the orthogonal direction is at least five times greater than the thermal conductivity in the stacking direction, for example. In this example embodiment, a self-heat pipe having this kind of thermal conductive property is used for the output electrode 10.

In this example embodiment, as shown in FIG. 1, the power devices 12 and 14 are arranged stacked, via joining layers 40 and 42 of solder or the like, on the upper and lower surfaces at one end in the length direction of this output electrode 10. Therefore, when heat generated by the upper and lower power devices 12 and 14 is transferred to the output electrode 10, that heat moves quickly in the orthogonal direction but does not move much in the stacking direction. The output electrode 10 in this example embodiment has low thermal conductivity in the stacking direction, so thermal interference does not easily occur between the pair of power devices 12 and 14. Also, the thermal conductivity in the orthogonal direction is high, so a large amount of heat is released at the exposed portion 10a of the output electrode 10. Together, these factors make the power devices 12 and 14 less prone to overheating. The output electrode 10 that works in this way also functions as an insulating member between the upper and lower power devices 12 and 14. The thickness of the heat pipe used for the output electrode 10 is approximately 2 millimeters, and the thickness of the joining layers 40 and 42 is approximately several tenths of a millimeter to 1 millimeter.

An output electrode cooler 20 for cooling the output electrode 10 is mounted to the exposed portion 10a on the other end side of the output electrode 10 via an insulating layer 44 that insulates electricity.

In this example embodiment, the output electrode cooler 20 is made of silicon. The reason for using silicon as the material for the cooler is that silicon has almost the same thermal expansion coefficient as semiconductor material and it is easy to form deep grooves in with anisotropic wet etching, so it is easy to form a cooler having multiple fins. As shown in FIG. 1, a supply passage 20a for supplying a cooling medium such as water, and a discharge passage 20b for discharging cooling medium that has recovered heat are connected to the output electrode cooler 20. The thickness of the output electrode cooler 20 is approximately 3 millimeters. Incidentally, the cooler used for the output electrode cooler 20 is not limited to the water-cooled type cooler described above. That is, it may also be an air-cooled type cooler.

Cooling the exposed portion 10a of the output electrode 10 with this output electrode cooler 20 increases the amount of heat that is released at the exposed portion 10a of the output electrode, and promotes the transfer of heat from the other end side that is sandwiched by the heat generating power devices 12 and 14. Heat transferred from the power devices 12 and 14 to the output electrode 10 is removed by this output electrode cooler 20 when necessary, so the heat removing performance of the output electrode 10 can be kept high, which enables the heat generated by the power devices 12 and 14 to be continuously absorbed. As a result, a power module 1 in which the power devices 12 and 14 will not easily overheat is able to be obtained.

An aluminum cooler, which is well-known, may also be used for the output electrode cooler 20. Also the insulating layer 44 is formed by insulating material that does not conduct electricity. Examples of the insulating material used include ceramic material such as AlN or Si3N4, and resin material such as epoxy.

As shown in FIG. 1, the N-electrode 16 is provided via a joining layer 50 on the upper surface of the power device 12. Similarly, the P-electrode 18 is provided via a joining layer 52 on the lower surface of the power device 14. The N-electrode 16 and the P-electrode 18 both function as power terminals. The N-electrode 16 and the P-electrode 18 are each made of a conductive member that has a low expansion coefficient, such as copper, and is formed in a plate shape. The thickness of the N-electrode 16 and the P-electrode 18 is approximately several tenths of a millimeter to 1 millimeter.

As described above, the N-electrode 16 and the P-electrode 18 each have a stacked portion 16a and 18a, a gap-changing portion 16b and 18b, and a close opposing portion 16c and 18c. As shown in FIG. 1, the N-electrode 16 and the P-electrode 18 maintain an opposing positional relationship at all of these portions. At the close apposing portions 16c and 18c, current flows in opposite directions through the electrodes 16 and 18, i.e., in one direction in one electrode 16 and in the opposite direction in the other electrode 18, such that reverse magnetic fields are produced. These reverse magnetic fields end up negating each other, such that mutual inductance that reduces parasitic inductance is generated. As a result, parasitic inductance can be reduced.

The mutual inductance between the N-electrode 16 and the P-electrode 18 increases as the gap between the close opposing portions 16c and 18c becomes smaller, and increases as the distance between the close opposing portions 16c and 18c becomes greater. Therefore, the close opposing portions 16e and 18c preferably face one another in positions as close as possible to each other, the length of the close opposing portions 16c and 11c is preferably made as long as possible, and the lengths the stacked portions 16a and 18a and the gap-changing portions 16b and 18b where the gap between the electrodes 16 and 18 widens are preferably made as short as possible.

Also, as shown in FIG. 1, on the N-electrode 16 and the P-electrode 18, the lengths of the stacked portions 16a and 18a are the same, and the lengths of the gap-changing portions 16b and 18b where the gap between the electrodes 16 and 18 widens are the same. Also, although not shown, the lengths of the portions where the gap widens after diverging from the close opposing portions 16c and 18c are also the same on the other end side of the N-electrode 16 and the P-electrode 18, i.e., on the side that is connected to a motor and the like. Having the lengths of the N-electrode 16 and the P-electrode 18 be the same in this way improves the balance between the N-electrode 16 and the P-electrode 18, such that mutual inductance is able to be effectively generated.

As shown in FIG. 1, the thin plate-shaped condenser 34 is connected, via joining layers 46 and 48, in a position between the close opposing portions 16e and 18c and near the power devices 12 and 14. In this example embodiment, a thin plate-shaped condenser having SrTiO3 as its main component is used for the condenser 34. The thickness of the condenser 34 is approximately several tenths of a millimeter to 1 millimeter. Connecting the condenser 34 between the close opposing portions 16c and 18c makes it possible to reduce surge voltage that is generated during switching operations of the power devices 12 and 14. Also, as described above, the position where the condenser 34 is connected is preferably a position between the close opposing portions 16c and 18 and as close as possible to the power devices 12 and 14 in order to maximize the function of the condenser.

The thermoelectric transducer 22 is mounted above the stacked portion 16a of the N-electrode 16 and is surrounded by the thermal mass member 26, and the thermoelectric transducer 24 is mounted below the stacked portion 18a of the P-electrode 18 and is surrounded by the thermal mass member 28. As shown in FIG. 1, ah 25, insulating layer 54 that insulates electricity is formed between the N-electrode 16, and the thermoelectric transducer 22 and the thermal mass member 26. Similarly, an insulating layer 56 that insulates electricity is formed between the P-electrode 18, and the thermoelectric transducer 24 and the thermal mass member 28. The thermoelectric transducers 22 and 24 in this example embodiment are each formed of a thin film of BiTe, the thickness of which is no more than 2 millimeters. Wiring paths, not shown, are provided in these thermoelectric transducers 22 and 24, such that current can be passed through the thermoelectric transducers 22 and 24. Passing current through the thermoelectric transducers 22 and 24 enables the thermoelectric transducers 22 and 24 to absorb the heat on the N-electrode 16 and P-electrode 18 side, and release that heat to the thermal mass member 26 and 28 side. The insulating layers 54 and 56 are formed of insulting material that does not conduct electricity. Examples of the insulating material used include ceramic material such as AlN or Si3N4, and resin material such as epoxy.

The thermoelectric transducer 22 is mounted in a position directly above substantially the center portion of the power device 12. Similarly, the thermoelectric transducer 24 is mounted in a position directly below substantially the center portion of the power device 14. When the power devices 12 and 14 generate heat, the area around the center portion of those power devices 12 and 14 becomes the hottest, so placing the thermoelectric transducers 22 and 24 in this way enables the heat at that portion to be absorbed effectively.

In this example embodiment, the temperatures of power devices 12 and 14 can be lowered before the power devices 12 and 14 even generate heat, by passing current through the thermoelectric transducers 22 and 24 in advance and absorbing heat from the N-electrode 16 and the P-electrode 18. Cooling the power devices 12 and 14 in this way prevents them from overheating even if they generate a large amount of heat in a short period of time. Therefore, the durability of the power devices 12 and 14 is further improved, such that the power module 1 is even less likely to become damaged.

The thermal mass members 26 and 28 are formed from thin plates of Si—SiC or the like, and function as heat receptors that receive the heat released from the thermoelectric transducer 22 and 24. The combined thickness of the thermoelectric transducer 22 and 24 and the surrounding thermal mass members 26 and 28 is approximately 3 millimeters.

As shown in FIG. 1, the cooler 30 is provided above the thermal mass member 26, and the cooler 32 is provided below the thermal mass member 28. Coolers having the same structure as the output electrode cooler 20 described above may be used for these coolers 30 and 32. A supply passage 30a and 32a for supplying a cooling medium such as water, and a discharge passage 30b and 32b for discharging cooling medium that has recovered heat are connected to each of the coolers 30 and 32. The thickness of each of these coolers 30 and 32 is approximately 3 millimeters. Incidentally, the coolers used for the coolers 30 and 32 are not limited to the water-cooled type coolers described above. That is they may also be air-cooled type coolers.

The power module 1 of this example embodiment structured as described above has excellent durability because thermal interference will not occur between the pair of power devices 12 and 14 that are stacked with the output electrode 10 arranged therebetween, so the power devices 12 and 14 will not easily overheat.

(Test) The power module 1 of the example embodiment structured as described above was prepared for each of three phases. The wiring and conduits were formed the same for all three phases. Then each power module was operated as an inverter, and loss, surge voltage, and the highest temperature of the power devices were measured.

The loss was measured while changing the carrier frequency. The results were as follows. The ratio of constant loss to switching loss at 5 kHz was 1:0.2. Also, the surge voltage when off was 30 V with respect to the power supply voltage. Further, the highest temperature reached rapidly, such as when a motor is started, for example, by the power devices 12 and 14 when the thermoelectric transducers 22 and 24 were operated was measured and found to be 120° C.

As a comparative example to this, a related power module that has been widely produced in the past and is formed with two power devices arranged on a plane on a single cooler was prepared and the same measurements were taken. The results were as follows. The ratio of constant loss to switching loss was 1:1, the surge voltage was 100 V, and the temperature of the devices under the same conditions described above was 140° C.

From these results, it is evident that with the power module of this example embodiment, the switching loss is less, the surge voltage is lower, and the temperature of the power devices is also dramatically lower than normal compared with a typical related power module.

Second Example Embodiment

A second example embodiment of the power module of the invention will now be described with reference to FIG. 2 which is a sectional view showing a frame format of the main portions of the power module according to this second example embodiment. The power module of this example embodiment is also a power module that forms part of a three-phase inverter that is formed by three phases (U, W, and V), just as in the first example embodiment.

Figure 2:
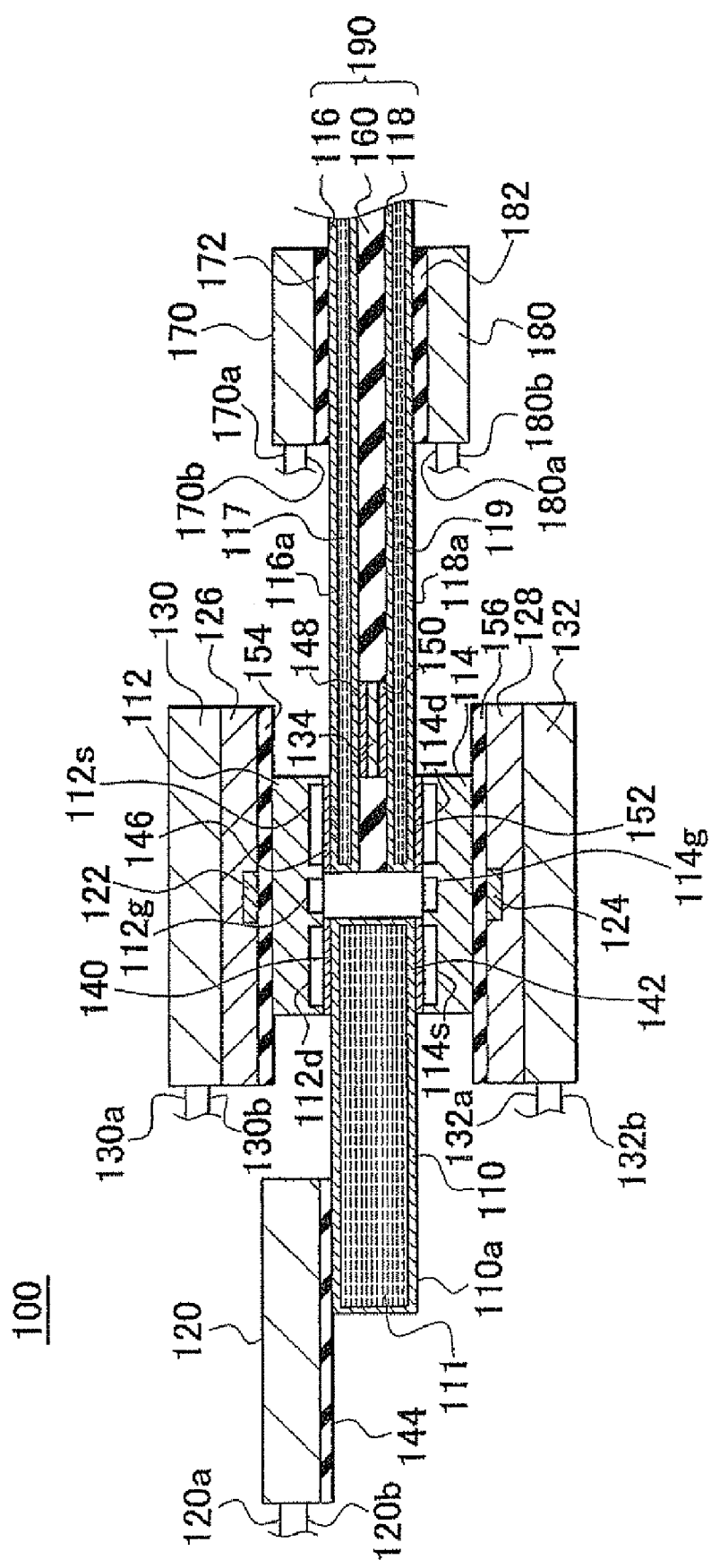
FIG. 2 is a sectional view showing a frame format of the main portions of a power module according to a second example embodiment of the invention.

As shown in FIG. 2, the power module 100 of this example embodiment has a plate-shaped output electrode 110, an electrode unit 190, and a pair of power devices 112 and 114 that are stacked with the plate-shaped output electrode 110 and the electrode unit 190 arranged between the pair of power devices 112 and 114. The output electrode 110 is laminated to the power devices 112 and 114 at the portion of the area where the power devices 112 and 114 are stacked (hereinafter simply referred to as the stacked area). The output electrode 110 extends from the stacked area of the power devices 112 and 114 in a direction orthogonal to the stacking direction (i.e., orthogonal to the vertical direction in FIG. 2). Hence, hereinafter, the direction in which the output electrode 10 extends will be referred to as the orthogonal direction. An output electrode cooler 120 is mounted to an exposed portion 110a of the output electrode 110 that extends in the orthogonal direction from the stacked area.

The electrode unit 190 has a plate-shaped insulating layer 160, and an N-electrode 116 and a P-electrode 118 that are stacked with this insulating layer 160 arranged between the N-electrode 116 and the P-electrode 118. The electrode unit 190 is laminated to the power devices 112 and 114, in a region of the stacked area where the output electrode 110 is not laminated to the power devices 112 and 114. The electrode unit 190 extends in an orthogonal direction from the stacked area. The direction in which the electrode unit 190 extends is opposite the direction in which the output electrode 110 extends. The N-electrode 116 is laminated to the power device 112, and the P-electrode 118 is laminated to the power device 114. The N-electrode 116 is laminated to the surface of the power device 112 that is on the side facing the power device 114, in the region where the output electrode 110 is not laminated to the power device 112. Similarly, the P-electrode 118 is laminated to the surface of the power device 114 that is on the side facing the power device 112, in the region where the output electrode 110 is not laminated to the power device 114. An N-electrode cooler 170 is provided on the exposed portion 116a of the N-electrode 116 that extends in the orthogonal direction. Similarly, a P-electrode cooler 180 is provided on the exposed portion 118a of the P-electrode 118 that extends in the orthogonal direction. Also, a condenser 134 is embedded in a portion of the insulating layer 160 that extends in the orthogonal direction and is near the stacked area. This condenser 134 is connected to both the upper N-electrode 116 and the lower P-electrode 118.

A thermoelectric transducer 122 is mounted above the power device 112 and a thermoelectric transducer 124 is mounted below the power device 114. Moreover, the thermoelectric transducer 122 is surrounded by a thermal mass member 126, and the thermoelectric transducer 124 is surrounded by a thermal mass member 128. A cooler 130 is mounted above the thermal mass member 126, and a cooler 132 is mounted below the thermal mass member 128.

Incidentally, the overall thickness of the power module 100 in this example embodiment is approximately 20 millimeters.

In this example embodiment, horizontal power MOSFETs are used as the power devices 112 and 114. That is, each of the power devices 112 and 114 has all of the electrodes on one surface of a substrate. In FIG. 2, three electrodes of the power device 112, i.e., a drain electrode 112d, a source electrode 112s, and a gate electrode 112g, are all formed on one surface (i.e., the lower surface in FIG. 2) of the substrate of the power device 112. Similarly, three electrodes of the power device 114, i.e., a drain electrode 114d, a source electrode 114s, and a gate electrode 114g, are all formed on one surface (i.e., the upper surface in FIG. 2) of the substrate of the power device 114. Hereinafter in this example embodiment, the surface of both the power devices 112 and 114 that is on the side where the electrode is formed will be referred to as the electrode forming surface, and the side where the electrode is not formed will be referred to as the back surface. In this example embodiment, the pair of power devices 112 and 114 are arranged with the electrode forming surfaces opposite each other. In FIG. 1, the drain electrode 112d is opposite the source electrode 114s, the source electrode 112s is opposite the drain electrode 114d, and the gate electrode 112g is opposite the gate electrode 114g. Aside from the horizontal power MOSFET described above, another horizontal semiconductor device such as a horizontal IGBT can also be used for each of the power devices 112 and 114 in this example embodiment. The thickness of each of these power devices 112 and 114 is approximately several tenths of a millimeter to 1 millimeter.

The output electrode 110 is formed by a plate-shaped self-heat pipe. This self-heat pipe is similar to the self-heat pipe used for the output electrode 10 in the first example embodiment described above. This output electrode 110 is also filled with fluid 111 for transferring heat. This self-heat pipe is also anisotropic such that the thermal conductivity in the orthogonal direction (i.e., the horizontal direction) is greater than the thermal conductivity in the stacking direction (i.e., the vertical direction). The thickness of the heat pipe used for the output electrode 110 is approximately 2 to 5 millimeters.

In this example embodiment, the power device 112 is arranged laminated to the upper surface on one end side in the length direction of this output electrode 110 via a joining layer 140 of solder or the like. Accordingly, the upper surface on one end side in the length direction of the output electrode 110 is connected to the drain electrode 112*d* of the power device 112. Also, the power device 114 is arranged laminated to the lower surface on one end side in the length direction of this output electrode 110 via a joining layer 142 of solder or the like. Accordingly, the lower surface on one end side in the length direction of the output electrode 110 is connected to the source electrode 114*s* of the power device 114. In this example embodiment, the one end side in the length direction of the output electrode 110 is laminated to the power device 112 and 114 at the portion of the stacked area of those power devices 112 and 114 where the drain electrode 112*d* and the source electrode 114*s* oppose each another. The thickness of each of the joining layers 140 and 142 is approximately several tenths of a millimeter to 1 millimeter.

The electrode unit 190 has a plate-shaped insulating layer 160, and an N-electrode and a P-electrode that are stacked with this insulating layer 160 arranged therebetween. In this example embodiment, the N-electrode 16 and the P-electrode are each formed of a plate-shaped self-heat pipe, just like the output electrode 110 described above. Therefore, the N-electrode 116 and the P-electrode 118 are also filled with fluid 117 and 119 for transferring heat. Incidentally, the N-electrode 116 and the P-electrode 118 may each also be made of a conductive member that has a low expansion coefficient, such as copper, and is formed in a plate shape.

The insulating layer 160 is made of flat insulting material that does not conduct electricity. The material used for this insulating layer 160 may be, for example, ceramic material such as AlN or $Si_3N_4$, or resin material such as epoxy. The thickness of the N-electrode 116 and the P-electrode 118 is approximately several tenths of a millimeter to 1 millimeter each. The overall thickness of the electrode unit 190 is approximately 2 to 5 millimeters. In this example embodiment, the overall thickness of the electrode unit 190 is generally the same as the thickness of the output electrode 110 described above.

In this example embodiment, the power device 112 is arranged laminated to the upper surface on one end side in the length direction of the N-electrode 116 via a joining layer 146. Accordingly, the upper surface on one end side in the length direction of the N-electrode 116 is connected to the source electrode 112*s* of the power device 112. Similarly, the power device 114 is arranged laminated to the lower surface on one end side in the length direction of the P-electrode 118 via a joining layer 152. Accordingly, the lower surface on one end side in the length direction of the P-electrode 118 is connected to the drain electrode 114*d* of the power device 114. In this example embodiment, the one end side in the length direction of the N-electrode 116 and the P-electrode 118 is laminated to the power device 112 and 114, respectively, at the portion of the stacked area of those power devices 112 and 114 where the source electrode 112*s* and the drain electrode 114*d* oppose one another. The thickness of each of the joining layers 146 and 152 is approximately several tenths of a millimeter to 1 millimeter.

Incidentally, a gate wire, not shown is connected to each of the gate electrodes 112*g* and 114*g* of the power devices 112 and 114.

In the power module 100 of this example embodiment, the pair of power devices 112 and 114, the output electrode 110, and the N-electrode 116, and the P-electrode 118 are arranged stacked in the manner described above. Therefore, when heat generated by the upper and lower power devices 112 and 114 is transferred to the output electrode 110, the N-electrode 116, and the P-electrode 118, that heat quickly moves in the orthogonal direction, but does not move much in the stacking direction. The output electrode 110, the N-electrode 116, and the P-electrode 118 in this example embodiment have low thermal conductivity in the stacking direction, so thermal interference does not easily occur between the pair of power devices 112 and 114. Also, the thermal conductivity in the orthogonal direction is high, so a large amount of heat is released at the exposed portion 110*a* of the output electrode 110, the exposed portion 116*a* of the N-electrode 116, and the exposed portion 118*a* of the P-electrode 118. Together, these factors make the power devices 112 and 114 less prone to overheating. The output electrode 110, the N-electrode 116, and the P-electrode 118 that work in this way also function as insulating members between the upper and lower power devices 112 and 114.

An output electrode cooler 120 for cooling the output electrode 110 is provided, via an insulating layer 144 that insulates electricity, on the exposed portion 110*a* that is on the other end side of the output electrode 110. Similarly, an N-electrode cooler 170 is provided, via an insulating layer 172 that insulates electricity, on the exposed portion 116*a* of the N-electrode 116, and a P-electrode cooler 180 is provided, via an insulating layer 182 that insulates electricity, on the exposed portion 118*a* of the P-electrode 118. In this example embodiment as well, these coolers 120, 170, and 180 are made of silicon, just like the cooler 20 in the first example embodiment. The coolers 120, 170, and 180 are each provided with a supply passage 120*a*, 170*a*, and 180*a* for supplying a cooling medium such as water, and a discharge passage 120*b*, 170*b*, and 180*b* for discharging cooling medium that has recovered heat. The thickness of each of these coolers 120, 170, and 180 is approximately 3 millimeters. The insulating layers 144, 172, and 182 are all formed of the same insulating material as the insulating layer 160 described above.

The exposed portion 110*a* of the output electrode 110 is cooled by the cooler 120, the exposed portion 116*a* of the N-electrode 116 is cooled by the cooler 170, and the exposed portion 118*a* of the P-electrode is cooled by the cooler 180. As a result, the amount of heat released, at these exposed portions 110*a*, 116*a*, and 118*a* increases, thus enabling the heat that is transferred from the heat-generating power devices 112 and 114 to the output electrode 110, the N-electrode 116, and the P-electrode 118 to be removed when necessary. Accordingly, the heat removing performance of the output electrode 110, the N-electrode 116, and the P-electrode 118 can be kept high, so the heat generated by the power devices 112 and 114 can be continuously absorbed. As a result, a power module 100 in which the power devices 112 and 114 will not easily overheat is able to be obtained.

Incidentally, the coolers used for the coolers 120, 170, and 180 are not limited to water-cooled type coolers. That is, they may also be air-cooled type coolers. Moreover, aluminum coolers, which are well-known, may also be used for the output electrode coolers 120, 170, and 180. Further, in this example embodiment, the output electrode 110, the N-electrode 116, and the P-electrode 118 may also be cooled by other cooling means instead of these coolers 120, 170, and 180. For example, the output electrode 110, the N-electrode 116, and the P-electrode 118 may instead be cooled by being placed in contact with a case, not shown, for mounting the power module 100 via an insulating member that insulates electricity, and releasing the heat transferred to the output electrode 110, the N-electrode 116, and the P-electrode 118 to the case.

In this example embodiment, the N-electrode 116 and the P-electrode 118 maintain their positional relationship opposing one another with the insulating layer 160 arranged therebetween. Mutual inductance that reduces parasitic inductance is generated by passing current in opposite directions through the electrodes 116 and 118, i.e., in one direction through the N-electrode 116 and in the opposite direction through the P-electrode 118, to produce reverse magnetic fields which then negate each other. As a result, parasitic inductance can be reduced. The mutual inductance between the N-electrode 116 and the P-electrode 118 increases as the gap between the opposing electrodes 116 and 118 becomes smaller, and increases as the gap between the opposing portions 116 and 118 that are close becomes greater. In this example embodiment, the thickness of the insulating layer 160 is approximately several tenths of a millimeter to 1 millimeter, so the distance between the N-electrode 116 and the P-electrode 118 that oppose each other is kept small at approximately several tenths of a millimeter to 1 millimeter along substantially the entire length of the electrodes 116 and 118. Therefore, the power module 100 in this example embodiment can generate the maximum amount of mutual inductance between the N-electrode 116 and the P-electrode 118.

In this example embodiment, the N-electrode 116 and the P-electrode 118 are structured such that the lengths that oppose each other via the insulating layer 160 are the same. Also, although not shown, the lengths of the portions where the gap widens after the electrodes 116 and 118 diverge are also the same on the other end side of the N-electrode 116 and the P-electrode 118, i.e., on the side that is connected to a motor and the like. Having the lengths of the N-electrode 116 and the P-electrode 118 are the same improves the balance between the N-electrode 116 and the P-electrode 118, such that mutual inductance is able to be effectively generated.

As shown in FIG. 2, the thin condenser 134 is embedded in the insulating layer 160 in a position near the stacked area of the power devices 112 and 114. This condenser 134 is connected to the exposed portion 116a of the N-electrode 116 via a joining layer 148, and to the exposed portion 118a of the P-electrode 118 via a joining layer 150. Just like the condenser 34 in the first example embodiment, a thin plate-shaped condenser having SrTiO3 as its main component is also used for the condenser 134 of this example embodiment. The thickness of the condenser 134 is approximately several tenths of a millimeter to 1 millimeter. Connecting the condenser 134 between the N-electrode 116 and the P-electrode 118 makes it possible to reduce surge voltage that is generated during switching operations of the power devices 112 and 114. Also, the position where the condenser 134 is connected is preferably a position that is as close as possible to the power devices 112 and 114 in order to maximize the function of the condenser. Incidentally, the condenser 134 may also be embedded in the insulating layer 160 in an area where the insulating layer 160 and the power devices 112 and 114 are all stacked together.

The thermoelectric transducer 122 is provided above the back surface of the power device 112 and surrounded by the thermal mass member 126, and the thermoelectric transducer 124 is provided below the back surface of the power device 114 and surrounded by the thermal mass member 128. As shown in FIG. 2, the insulating layer 154 that insulates electricity is formed between the back surface of the power device 112, and the thermoelectric transducer 122 and the thermal mass member 126. Similarly, the insulating layer 156 that insulates electricity is formed between the back surface of the power device 114, and the thermoelectric transducer 124 and the thermal mass member 128.

The thermoelectric transducers 122 and 124 of this example embodiment are each formed of a thin film of BiTe, the thickness of which is no more than 2 millimeters, just as in the first example embodiment described above. Wiring paths, not shown, are formed in these thermoelectric transducers 122 and 124, such that current can be passed through the thermoelectric transducers 122 and 124. Passing current through the thermoelectric transducers 122 and 124 enables the thermoelectric transducers 122 and 124 to absorb the heat on the N-electrode 116 and P-electrode 118 side, and release that heat to the thermal mass member 126 and 128 side. The thermoelectric transducer 122 is mounted in a position directly above substantially the center portion of the power device 112. Similarly, the thermoelectric transducer 124 is mounted in a position directly below substantially the center portion of the power device 114. When the power devices 112 and 114 generate heat, the area around the center portion of those power devices 112 and 114 becomes the hottest, so placing the thermoelectric transducers 122 and 124 in this way enables the heat at that portion to be absorbed effectively. Incidentally, the insulating layers 154 and 156 are formed of insulting material that does not conduct electricity. Examples of the insulating material used include ceramic material such as AlN or Si3N4, and resin material such as epoxy.

In this example embodiment, the temperatures of power devices 112 and 114 can be lowered before the power devices 112 and 114 even generate heat by passing current through the thermoelectric transducers 122 and 124 in advance and absorbing heat from the N-electrode 116 and the P-electrode 118. Cooling the power devices 112 and 114 in this way prevents them from overheating even if they generate a large amount of heat in a short period of time. Therefore, the durability of the power devices 112 and 114 is further improved; such that the power module 100 is even less likely to become damaged.

The thermal mass members 126 and 128 are formed from thin plates of Si—SiC or the like, and function as heat receptors that receive the heat released from the thermoelectric transducer 122 and 124. The combined thickness of the thermoelectric transducer 122 and 124 and the surrounding thermal mass members 126 and 128 is approximately 3 millimeters.

As shown in FIG. 2, the cooler 130 is provided above the thermal mass member 126, and the cooler 132 is provided below the thermal mass member 128. Coolers having the same structure as the output electrode cooler 120 described above may be used for these coolers 130 and 132. A supply passage 130a and 132a for supplying a cooling medium such as water, and a discharge passage 130b and 132b for discharging cooling medium that has recovered heat are connected to each of the coolers 130 and 132. The thickness of each of these coolers 130 and 132 is approximately 3 millimeters. Incidentally, the coolers used for the coolers 30 and 32 are not limited to the water-cooled type coolers described above. That is, they may also be air-cooled type coolers.

In this example embodiment, electrodes are not formed on the back surfaces of the power devices 112 and 114, so the entire back surface of each power device 112 and 114 can be used as a heat radiating surface. In this example embodiment, the entire back surface of the power device 112 contacts the insulating layer 154, and the entire back surface of the power device 114 contacts the insulating layer 156. Therefore, heat can be absorbed from the entire back surface of each power device 112 and 114 to the corresponding thermal mass member 126 and 128, so the power devices 112 and 114 are able to be cooled efficiently. As a result, a power module 100 in which the power devices 112 and 114 will not easily overheat is able to be obtained.

The power module 100 of this example embodiment structured as described above has excellent durability because thermal interference will not occur between the pair of power devices 112 and 114 that are stacked with the output electrode 110 arranged therebetween, so the power devices 112 and 114 will not easily overheat.

(Test) The power module 100 of the example embodiment structured as described above was prepared for each of three phases. The wiring and conduits were formed the same for all three phases. Then each power module 100 was operated as an inverter, and loss, surge voltage, and highest temperature of the power devices were measured.

The loss was measured while changing the carrier frequency. The results were as follows. The ratio of constant loss to switching loss at 5 kHz was 1:0.1. Also, the surge voltage when off was 15 V with respect to the power supply voltage. Further, the highest temperature reached rapidly, such as when a motor is started, for example, by the power devices 112 and 114 when the thermoelectric transducers 122 and 124 were operated was measured and found to be 115° C. Also, the power devices 112 and 114 were then replaced with test metal chips and the parasitic inductance between the N-electrode 116 and the P-electrode 118 was measured and found to be 5 nH.

As a comparative example to this, a related power module that has been widely produced in the past and is formed with two power devices arranged on a plane on a single cooler was prepared and the same measurements were taken. The results were as follows. The ratio of constant loss to switching loss was 1:1, the surge voltage was 100 V, and the temperature of the devices under the same conditions described above was 140° C. Also, the parasitic inductance was measured as described above and found to be 50 nH.

From these results, it is evident that with the power module of this example embodiment, the switching loss is less, the surge voltage is lower, and the temperature of the power devices is also dramatically lower than normal compared with a typical related power module. Moreover, it is also evident that the parasitic inductance is also dramatically lower than normal.

Some modified examples of the example embodiments will now be described.

Figure 3:
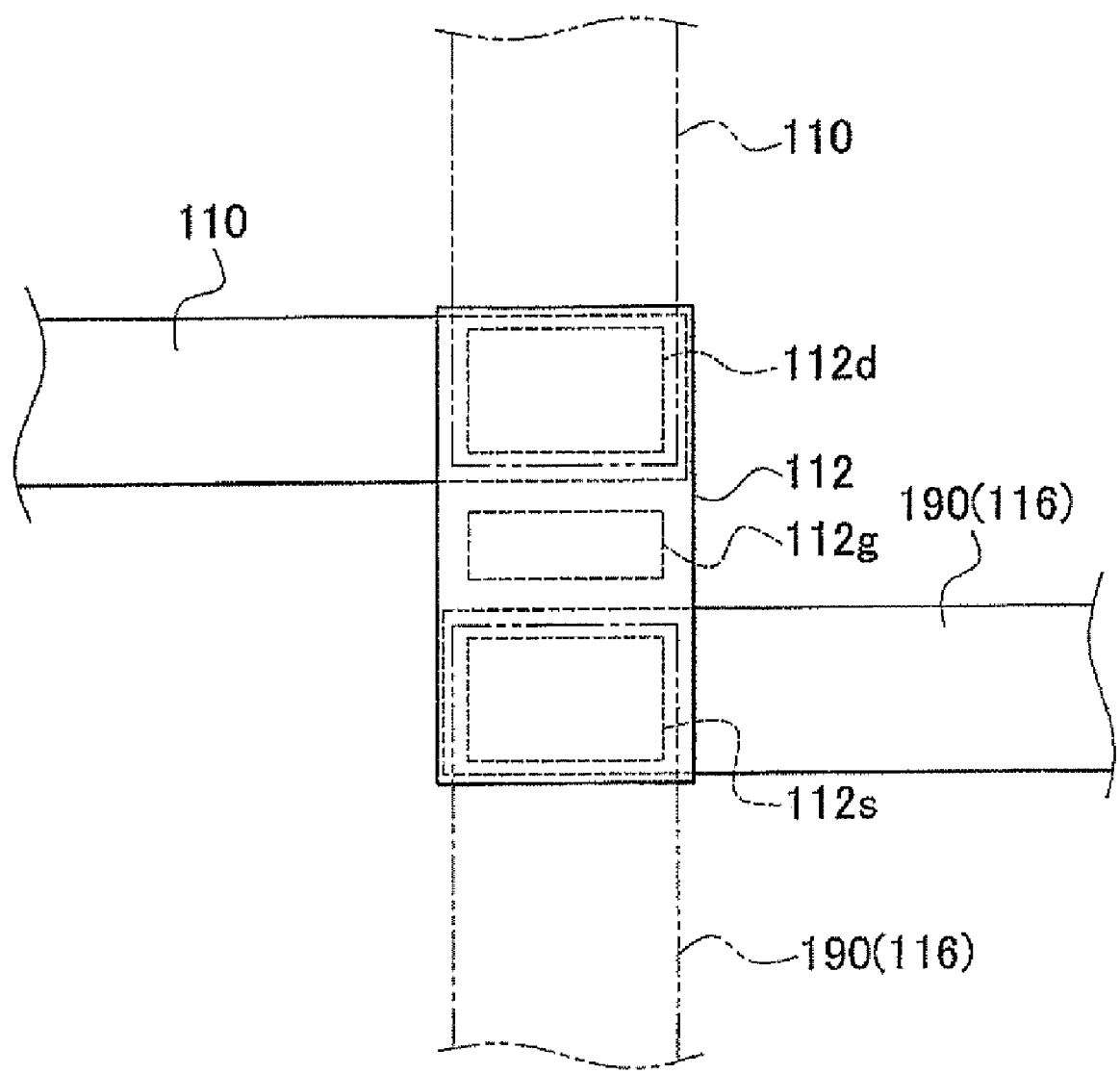
FIG. 3 is a plan view showing a frame format of a power module according to a modified example of the second example embodiment.

(1) FIG. 3 is a plan view showing a frame format of a power module according to a modified example of the second example embodiment. Incidentally, the coolers 120, 130, 132, 170, and 180 are not shown in FIG. 3. In the second example embodiment described above, the output electrode 110 and the electrode unit 190 are arranged extending from the stacked area of the power devices 112 and 114 in the length direction of the power device 112, as shown by the alternate long and short two dashes line in FIG. 3. However, the arrangement of the output electrode 110 and the electrode unit 190 is not limited to this. For example, the output electrode 110 and the electrode unit 190 may also be arranged extending in the width direction of the power device 112 from the stacked area of the power devices 112 and 114, as shown by the solid line portion in FIG. 3.

Figure 4:
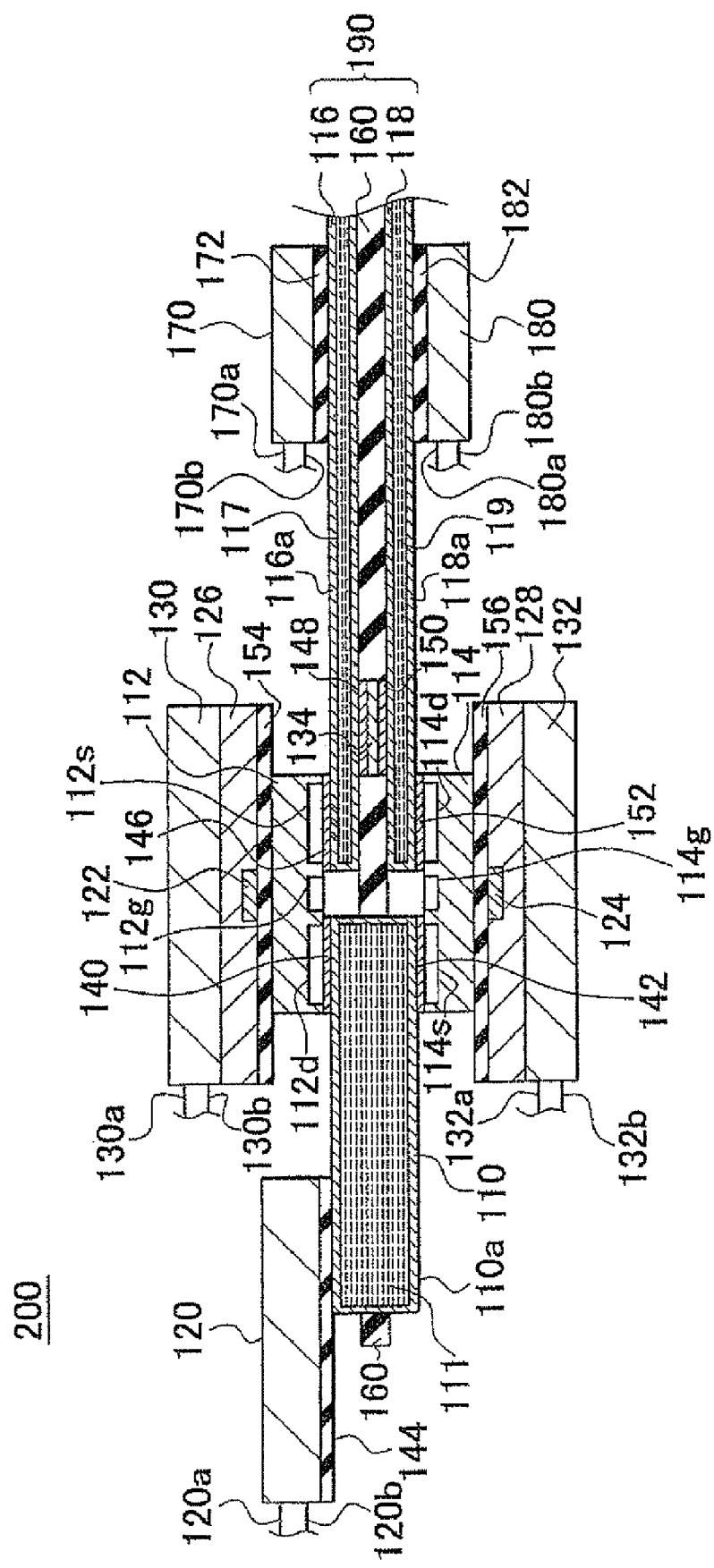
FIG. 4 is a sectional view showing a frame format of the main portions of a power module according to another modified example of the second example embodiment.

(2) In the second example embodiment described above, the output electrode 110 and the electrode unit 190 are provided separately, as shown in FIG. 2. The electrode unit 190 is formed by the N-electrode 116 and the P-electrode 118 that are stacked with the plate-shaped insulating layer 160 arranged therebetween. However, the configuration structure of the output electrode 110, the N-electrode 116, and the P-electrode 118 is not limited to this. FIG. 4 is a sectional view showing a frame format of the main portions of a power module according to a second modified example of the second example embodiment. As shown in FIG. 4, it is also possible to have the plate-shaped insulating layer 160 extend to the output electrode 110 side, and have the output electrode 110 embedded in the insulating layer 160. In this case, it is also possible to form a single electrode unit 200 in which the output electrode 110, the N-electrode 116, and the P-electrode 118 are all assembled to a single plate-shaped insulating layer 160 formed long in the orthogonal direction. If this kind of electrode unit 200 is used, the power devices 112 and 114, the output electrode 110, the N-electrode 116, and the P-electrode 118 can be stacked in the configuration shown in FIG. 4 simply by adhering the power device 112 to one surface of the electrode unit 200 and adhering the power device 114 to the other surface of the electrode unit 200. That is, in this modified example, the number of processes that it takes to stack the power devices 112 and 114, the output electrode 110, the N-electrode 116, and the P-electrode 118 can be reduced, which is advantageous in that it enables the power module 100 to be manufactured more easily.

(3) The plate-shaped insulating layer 160 may also be omitted, which is the reverse of the second modified example (2) described above. In this case as well, the N-electrode 116 and the P-electrode 118 are arranged extending in the orthogonal direction while maintaining the opposing positional relationship without contacting each other.

While specific example embodiments of the invention and modified examples thereof have been described in detail, they are no more than mere examples and are not intended to limit the scope of the claims for patent. The technology described in the claims includes various modifications and equivalent arrangements of the specific example embodiments and modified examples thereof described above.

Also, the technical elements described in this specification and illustrated in the accompanying drawings are technologically beneficial either individually or in any one of various combinations. Moreover, the technology illustrated in this specification and the accompanying drawings simultaneously achieves a plurality of objects, though the very fact that it achieves one of these objects makes it technically beneficial.

What is claimed is:

1. A power module comprising:
a plate-shaped output electrode;
a pair of power devices stacked with the output electrode arranged between the pair of power devices, the output electrode being laminated to the pair of power devices in part of a stacked area of the power devices; and
an N-electrode laminated to one of the power devices, and a P-electrode laminated to the other power device, the N-electrode and the P-electrode being laminated to surfaces of the power devices that face one another, in a region of the stacked area where the output electrode is not laminated to the power devices,
wherein the output electrode is anisotropic such that thermal conductivity in a direction orthogonal to a stacking direction in which the N-electrode and the P-electrode are stacked is greater than thermal conductivity in the stacking direction, and the output electrode extends in the orthogonal direction from the stacked area where the pair of power devices are stacked, and the N-electrode and the P-electrode extend in the orthogonal direction while maintaining an opposing positional relationship.

2. The power module according to claim 1, wherein the output electrode is laminated to the pair of power devices in part of the stacked area of the power devices, and the N-electrode and the P-electrode are laminated to the surfaces of the power devices that face one another, in a region of the stacked area where the output electrode is not laminated to the power devices.

3. The power module according to claim 1, wherein at least one of the N-electrode or the P-electrode is anisotropic such that the thermal conductivity in the orthogonal direction is greater than the thermal conductivity in the stacking direction.

4. The power module according to claim 1, wherein the N-electrode and the P-electrode are stacked with the pair of power devices arranged between the N-electrode and the P-electrode.

5. The power module according to claim 1, further comprising a cooler that is mounted to the output electrode in a region where the output electrode extends in the orthogonal direction from the stacked area.

6. The power module according to claim 1, further comprising a condenser that is connected between portions of the N-electrode and the P-electrode that extend in the orthogonal direction.

7. The power module according to claim 1, further comprising a thermoelectric transducer that is incorporated on the opposite side of one of the power devices from the side with the surface to which output electrode is laminated.

* * * * *